United States Patent
Ye et al.

(10) Patent No.: US 6,329,874 B1
(45) Date of Patent: *Dec. 11, 2001

(54) METHOD AND APPARATUS FOR REDUCING STANDBY LEAKAGE CURRENT USING A LEAKAGE CONTROL TRANSISTOR THAT RECEIVES BOOSTED GATE DRIVE DURING AN ACTIVE MODE

(75) Inventors: Yibin Ye, Portland; Vivek K. De, Beaverton, both of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/151,827

(22) Filed: Sep. 11, 1998

(51) Int. Cl.[7] .................................................. G05F 1/10
(52) U.S. Cl. ........................... 327/544; 327/390; 327/589
(58) Field of Search ...................................... 327/536, 537, 327/544, 589, 390

(56) References Cited

U.S. PATENT DOCUMENTS

| | | |
|---|---|---|
| 4,894,558 | 1/1990 | Conkle et al. . |
| 5,107,230 | 4/1992 | King . |
| 5,216,289 | 6/1993 | Hahn et al. . |
| 5,491,429 | 2/1996 | Gasparik . |
| 5,537,060 | 7/1996 | Baek . |
| 5,614,847 | 3/1997 | Kawahara et al. . |
| 5,617,043 | 4/1997 | Han et al. . |
| 5,751,651 | 5/1998 | Ooishi . |
| 5,773,999 | 6/1998 | Park et al. . |
| 5,781,062 * | 7/1998 | Mashiko et al. ...................... 327/544 |
| 5,801,576 * | 9/1998 | Ooishi ................................. 327/530 |
| 5,852,579 | 12/1998 | Arcoleo et al. . |
| 5,877,647 | 3/1999 | Vajapey et al. . |
| 5,889,415 | 3/1999 | Parkinson . |
| 5,929,687 * | 7/1999 | Yamauchi ............................ 327/544 |
| 6,031,778 * | 2/2000 | Makino et al. ...................... 327/534 |
| 6,034,563 * | 3/2000 | Mashiko .............................. 327/544 |

OTHER PUBLICATIONS

Thompson, et al.; "Dual Threshold Voltages and Substrate Bias: Keys to High Performance, Low Power, 0.1 um Logic Designs"; *1997 Symposium on VLSI Technology Digest of Technical Papers*; 1/97; pp. 69–70.

Kawaguchi, et al.; "A CMOS Scheme for 0.5V Supply Voltage with Pico–Ampere Standby Current"; *IEEE International Solid–State Conference*; Paper FP 12.4; 1/98; pp. 192–193.

Mutoh, et al.; "1–V Power Supply High–Speed Digital Circuit Technology with Multithreshold–Voltage CMOS"; *IEEE Journal of Solid State Circuits*; vol. 30, No. 8 8/95; pp. 847–854.

Halter, et al.; "A Gate–Level Leakage Power Reduction Method for Ultra–Low–Power CMOS Circuits"; *IEEE Custom Integrated Circuit Conference*; 8/97; 4 pages.

Kuroda, et al.; "A 0.9–V, 150–MHz, 10–mW, 4 mm$_2$, 2–D Discrete Cosine Transform Core Processor with Variable Threshold–Voltage (VT) Scheme"; *IEEE Journal of Solid–State Circuits*, vol. 31, No. 11, Nov. 1996; pp. 1770–1779.

* cited by examiner

Primary Examiner—Jung Ho Kim
(74) Attorney, Agent, or Firm—Cynthia T. Faatz

(57) ABSTRACT

Standby leakage reduction circuitry that uses boosted gate drive of a leakage control transistor during an active mode. A circuit block includes a first leakage control transistor coupled to receive a first supply voltage and coupled in series with an internal circuit block that performs a particular function. A gate drive circuit is included to apply a first boosted gate drive voltage to a gate of the first leakage control transistor during an active mode of the internal circuit block. The gate drive circuit furthers applies a standby gate voltage to the gate during a standby mode of the internal circuit block, the standby gate voltage to cause a gate to source voltage of the leakage control transistor to be reverse-biased.

21 Claims, 6 Drawing Sheets

METHOD AND APPARATUS FOR REDUCING STANDBY LEAKAGE CURRENT USING A LEAKAGE CONTROL TRANSISTOR THAT RECEIVES BOOSTED GATE DRIVE DURING AN ACTIVE MODE

BACKGROUND

1. Field

An embodiment of the present invention relates to integrated circuits, and more particularly, to a method and apparatus for reducing standby leakage current using a leakage control transistor that receives boosted gate drive during an active mode.

2. Discussion of Related Art

With the scaling of semiconductor process technologies, threshold voltages of semiconductor circuits are typically being reduced with reductions in supply voltages in order to maintain circuit performance. Lower transistor threshold voltages lead to significant increases in leakage current due to the exponential nature of sub-threshold conductance. Higher leakage currents lead to increased power dissipation which is undesirable for many semiconductor circuit applications. Higher leakage currents can be particularly problematic for mobile and handheld applications, for example.

One approach to addressing this issue has been to use multi-threshold voltage complementary metal oxide semiconductor (MTCMOS). An example of one MTCMOS scheme is shown in FIG. 1. In the MTCMOS approach of FIG. 1, low threshold voltage transistors are used for an internal circuit block 105 which is coupled to virtual power supply lines VVD and/or VGD. One or more higher threshold voltage transistors H1 and/or H2 are coupled in series between the internal circuit block 105 and the power supply lines VDD and/or GND, respectively. A standby signal STDBY and its complement STDBY#, which are used for active and standby mode control of the internal circuit block 240, are coupled to the gates of H1 and H2, respectively.

When STDBY is low, the internal circuit block 105 is in an active mode and H1 and H2 are turned on. VVD and VGD then function as the power supply lines for the internal circuit block 105. When STDBY is high, the internal circuit block 105 is in a standby mode and H1 and H2 are turned off. Leakage current of the internal circuit block 105 is suppressed due to the high threshold voltages of H1 and H2.

A disadvantage of this approach is that the higher threshold voltage devices H1 and H2 compromise the performance of the internal circuit block 105. Additionally, to maintain a low voltage drop between the power supply lines VDD and GND and the virtual power supply lines VVD and VGD, respectively, the linking devices H1 and H2 should be very large to reduce their resistance. Also, semiconductor processing of MTCMOS circuits is complicated by the need to provide transistors having multiple threshold voltage on the same integrated circuit die.

Another technique to reduce circuit leakage current uses substrate body bias to vary the threshold voltage of transistors in a circuit block for different modes. In this approach, during an active mode, a control circuit applies a voltage to the transistor bodies to zero- or reverse-bias the bodies with respect to the transistors. Upon entering a standby mode, the control circuit changes the substrate bias voltage to cause a reverse bias or deepen an existing reverse bias in the transistor bodies. In this manner, the threshold voltages of the transistors are increased during the standby mode to reduce or cut off leakage current.

A disadvantage of this approach is that a large change in body bias is required to change the transistor threshold voltages by even a small amount. Further, when changing from active mode to standby mode and vice versa, huge capacitances in transistor wells are switched from one voltage to another. Thus, significant power is dissipated during each mode transition.

SUMMARY OF THE INVENTION

A method and apparatus for reducing standby leakage current using a leakage control transistor that receives boosted gate drive during an active mode are described.

For one embodiment, a circuit includes a leakage control transistor coupled to receive a supply voltage and to be coupled in series with an internal circuit block that performs a particular function. The circuit further includes a gate drive circuit to apply a boosted gate drive voltage to a gate of the leakage control transistor during an active mode of the internal circuit block and to apply a standby voltage to the gate during a standby mode of the internal circuit block.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for reducing standby leakage current using a leakage control transistor that receives boosted gate drive during an active mode are described. In the following description, particular types of circuits are described for purposes of illustration. It will be appreciated, however, that other embodiments are applicable to other types of circuits.

For one embodiment, a circuit block includes an internal circuit block provided to perform a particular function. A first leakage control transistor has a first terminal to be coupled to the internal circuit block, a second terminal coupled to receive a first supply voltage and a gate. The gate of the first leakage control transistor is coupled to receive a first gate voltage when the internal circuit block is in an active mode and a second gate voltage when the internal circuit block is in a standby mode. The first gate voltage (referred to herein as a boosted gate drive voltage) is at a level to cause a boosted gate drive of the leakage control transistor, while the second gate voltage (referred to herein as a standby gate voltage) is at a level to cause a gate-to-source voltage (Vgs) of the first leakage control transistor to be reverse-biased.

One embodiment of the boosted gate drive enables a smaller transistor to be used during the active mode to achieve a same on-resistance value as a larger transistor that does not use a boosted gate drive. Reverse-biasing Vgs of the first leakage control transistor during the standby mode reduces standby leakage current of the internal circuit block as compared to the standby leakage current of the internal circuit block if it were directly connected to the first supply voltage.

Figure 1:
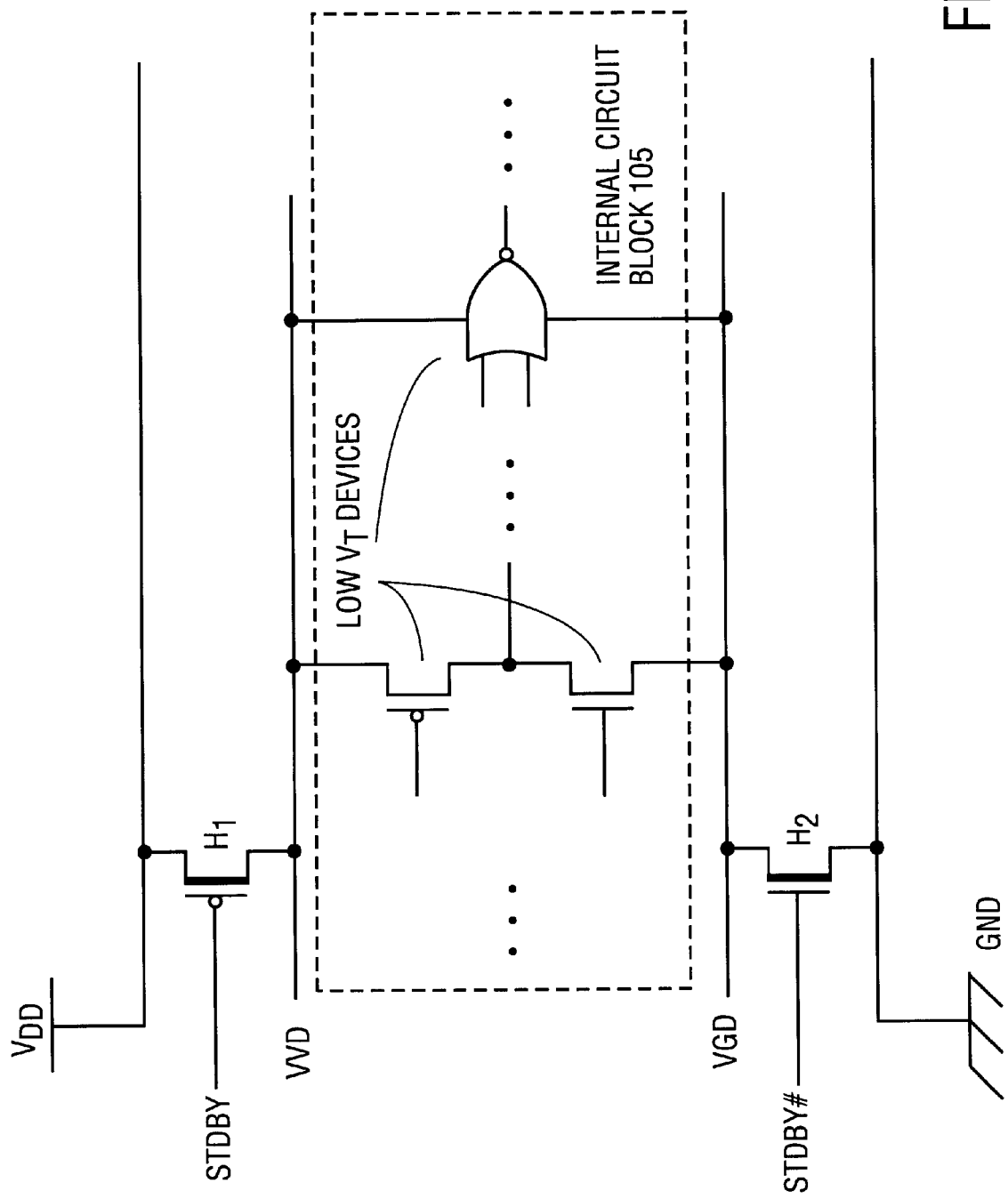
FIG. 1 is a schematic diagram showing a prior multi-threshold complementary metal oxide semiconductor approach to reducing standby leakage current.
Figure 2:
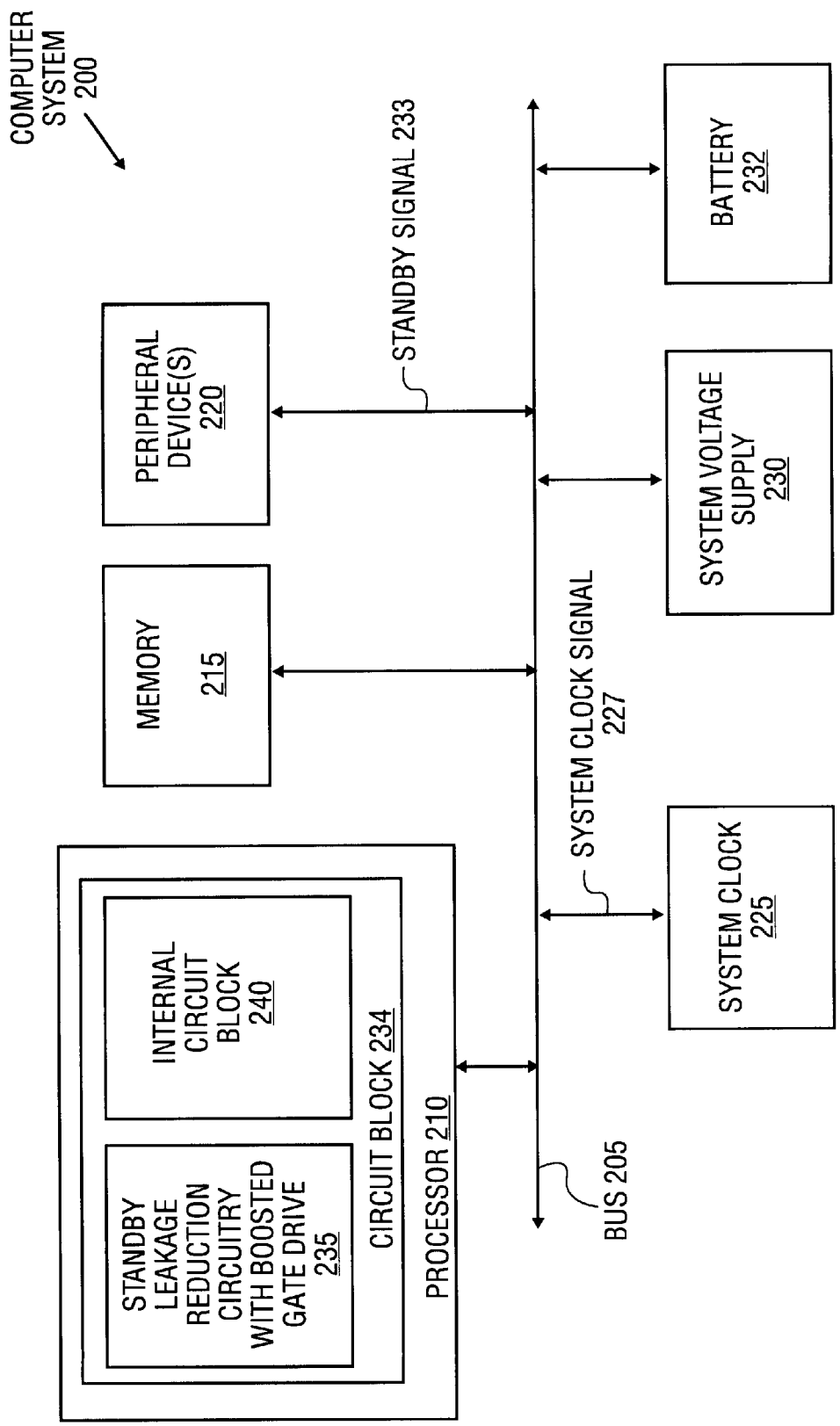
FIG. 2 is a block diagram showing an example of a computer system that may be advantageously used with one embodiment of the standby leakage reduction circuitry.

FIG. 2 is a block diagram showing an example of a mobile computer system 200 (e.g. laptop, notebook, or handheld computer) in which one embodiment of a standby leakage control approach using boosted gate drive may be implemented. The computer system 200 includes a bus 205 for communicating information among various components of the computer system 200. A processor 210 for processing instructions, one or more memories 215 to store instructions and information for use by the processor 210, one or more peripheral devices 220, a system clock 225, a system voltage supply 230, and a battery 232 are coupled to the bus 205 for one embodiment.

The system clock 225 provides a system clock signal 227 to one or more of the components of the computer system 200. The system voltage supply 230 provides a system operating voltage for the computer system 200. The peripheral device(s) 220 may provide a system standby signal 233 to cause the system 200 to enter a lower power mode in response to particular events.

For one embodiment, the processor 210 includes a circuit block 234 including standby leakage reduction circuitry 235 to reduce leakage current of an internal circuit block 240 during a standby mode. The standby leakage reduction circuitry 235 includes gate drive circuitry for one embodiment that provides a boosted gate drive during an active mode of the internal circuit block 240 to reduce the on-resistance of the standby leakage reduction circuitry 235 as described in more detail below. A circuit block, as the term is used herein, refers to interconnected circuitry having a set of inputs and a set of outputs wherein the circuit block is provided to perform one or more particular functions. A circuit block may be in the form of a functional unit block (FUB), for example, and typically includes many transistors forming various logic gates.

It will be appreciated that, for other embodiments, the standby leakage reduction circuitry 235 with boosted gate drive may be used with circuit blocks other than the internal circuit block 240 on other types of integrated circuit devices including, for example, chipsets and other peripheral chips.

It will also be appreciated that systems other than mobile or handheld computer systems, or computer systems configured in another manner than the computer system 200 of FIG. 2, may also be used with various embodiments.

Figure 3:
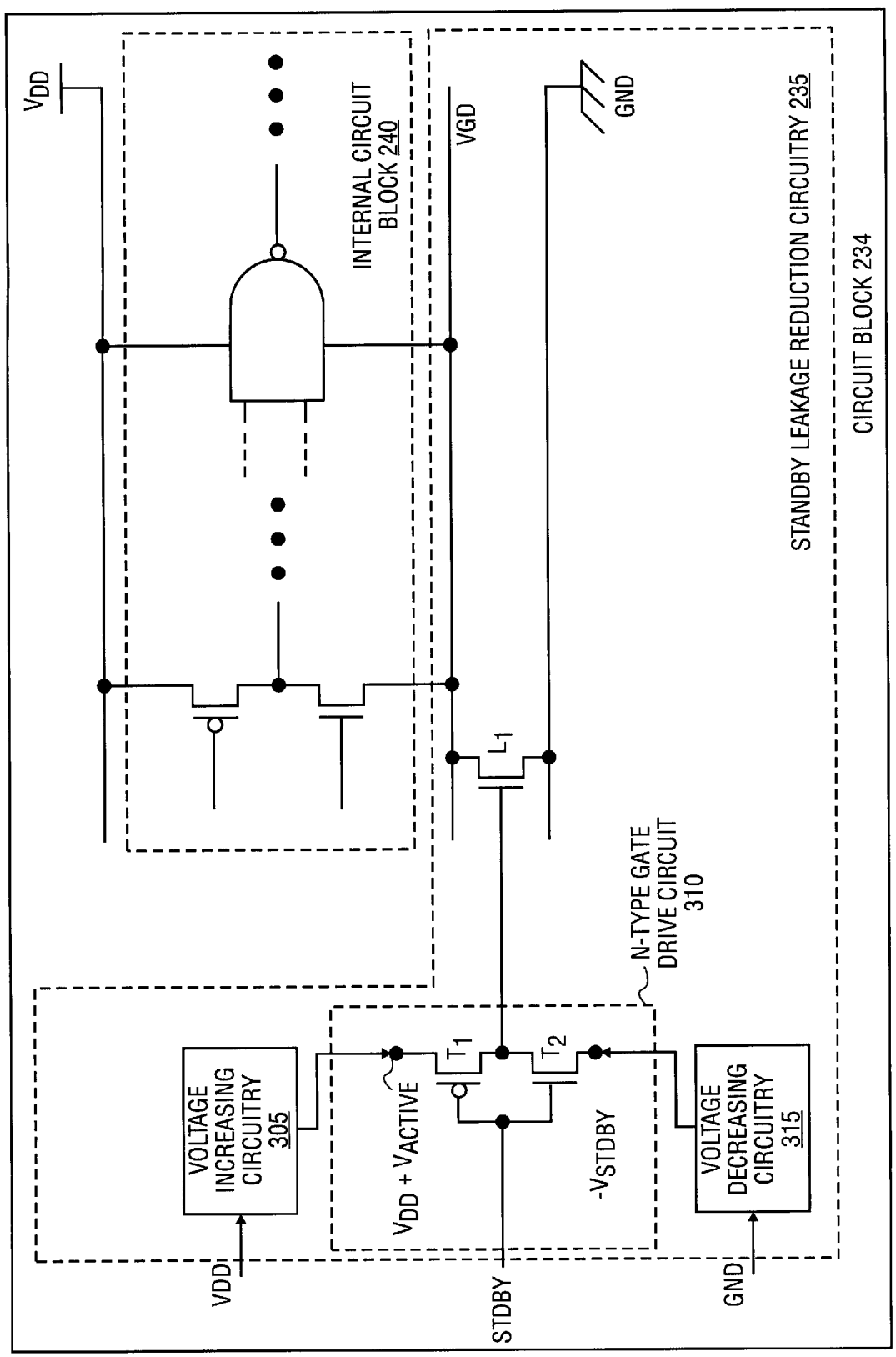
FIG. 3 is a schematic diagram showing one embodiment of standby leakage reduction circuitry of one embodiment in more detail.

FIG. 3 is a schematic diagram showing the standby leakage reduction circuitry 235 of one embodiment in more detail. The standby leakage reduction circuitry 235 includes voltage increasing circuitry 305, an n-type gate drive circuit 310, voltage decreasing circuitry 315 and a leakage control transistor $L_1$.

The leakage control transistor $L_1$ has a first terminal, a source terminal in his example, coupled to a virtual ground line VGD in series with the internal circuit block 240, a second terminal coupled to receive a ground supply voltage GND and a gate coupled to the n-type gate drive circuit 310. The n-type gate drive circuit 310 is referred to as such because it drives the gate of the n-type leakage control transistor $L_1$. For one embodiment, the n-type leakage control transistor $L_1$ has a same threshold voltage as one or more n-type transistors in the internal circuit block 240 where the internal circuit block includes both n- and p-type transistors. For one embodiment, the n-type leakage control transistor $L_1$ has the same threshold voltage as a majority of n-type transistors in the internal circuit block 240.

The voltage increasing circuitry 305 is coupled to receive a supply voltage VDD which is also used to power the internal circuit block 240. The supply voltage VDD may be provided by the system voltage supply 230 (FIG. 2), or VDD may be a separate supply voltage used for circuitry internal to the processor 210 (FIG. 2). The voltage increasing circuitry 305 provides to the n-type gate drive circuit 310 an output voltage VDD+$V_{ACTIVE}$ that is higher than the supply voltage VDD.

For one embodiment, the voltage increasing circuitry 305 includes a charge pump to supply the higher output voltage VDD+$V_{ACTIVE}$. The use of a charge pump and associated circuitry to provide and regulate a pumped output voltage is well-known to those of ordinary skill in the art and is not described in detail herein. An example of a charge pump that may be used for the voltage increasing circuitry 305 is provided in U.S. Pat. No. 5,524,266 to Tedrow et al. and assigned to the assignee of the present invention. For alternative embodiments, the voltage increasing circuitry 305 includes a switch capacitor, a different type of charge pump, or another means of providing a higher output voltage from a given input voltage.

The voltage decreasing circuitry 315 receives the ground supply voltage GND and provides to the n-type gate drive circuit 310 a voltage $-V_{STDBY}$ that is lower than GND. For one embodiment, the voltage decreasing circuitry 315 includes a negative charge pump to provide the lower output voltage $-V_{STDBY}$ from the ground input voltage. The use of a negative charge pump and associated circuitry to provide and regulate a selected lower output voltage is well-known to those of ordinary skill in the art and is not described in detail herein. An example of a negative charge pump that may be used in the voltage decreasing circuitry 315 is described in U.S. Pat. No. 5,532,915 to Pantelakis et al. and assigned to the assignee of the present invention. For alternative embodiments, a switch capacitor, a different type of negative charge pump, or another means of providing a lower output voltage from a given input voltage may be used to provide the voltage decreasing circuitry 315.

The n-type gate drive circuit 310 receives a standby signal STDBY. The STDBY signal may be a system standby signal such as the system standby signal 233 (FIG. 2), a local standby signal or any type of signal that causes the circuit block 234 to enter a lower power state at various times when the signal is asserted.

For one embodiment, the STDBY signal is a clock gating signal used to selectively prevent specific circuitry in the circuit block 234 from being clocked. In this manner, assertion of the STDBY signal is used to reduce power dissipation of the circuit block 234 and/or other circuitry at particular times. For one embodiment, when the STDBY signal is not asserted, the circuit block 234, and thus, the internal circuit block 240, is in an active mode.

For an alternative embodiment, an ACTIVE signal or any type of signal that puts the circuit block 234 into an active mode when asserted may be used in place of a STANDBY signal such that a low power mode is entered when the ACTIVE signal is deasserted. Whatever signal is used, it is desirable during the lower power mode to have the power dissipation of the circuit block 234, and in particular, the internal circuit block 240, as low as possible.

For the embodiment shown in FIG. 3, the STDBY signal controls the operation of the n-type gate drive circuit 310. When the STDBY signal is asserted (i.e. the circuit block 234 enters a standby mode), the voltage $-V_{STDBY}$ supplied by the voltage decreasing circuitry 315 is applied to the gate of the leakage control transistor $L_1$. Application of the standby gate voltage $-V_{STDBY}$, which is below the supply voltage GND, causes the gate-to-source voltage Vgs of the leakage control transistor $L_1$ to be reverse-biased. Reverse-biasing of the gate-to-source voltage Vgs cuts off the leakage path for the internal circuit block 240 during the standby mode such that standby leakage current of the circuit block 234 is significantly reduced.

When the STDBY signal is deasserted (indicating an active mode of the circuit block 234), the voltage VDD+$V_{ACTIVE}$ supplied by the voltage increasing circuitry 305 is applied to the gate of the leakage control transistor $L_1$. Application of the voltage VDD+$V_{ACTIVE}$ to the gate of the leakage control transistor $L_1$ causes a boosted gate drive of the leakage control transistor $L_1$. Boosted gate drive refers to driving the gate of a transistor using a boosted gate drive voltage higher than the high supply voltage used to drive the surrounding circuitry for an n-type transistor, or for a p-type transistor, using a boosted gate drive voltage lower than the low supply voltage used to drive the surrounding circuitry. Boosted gate drive of the transistor $L_1$ reduces its resistance during an active mode of the circuit block 234 such that the transistor $L_1$ can be smaller in size than a transistor with the same on-resistance where boosted gate drive is not used.

For one embodiment, the n-type gate drive circuit 310 includes a p-type transistor $T_1$ and an n-type transistor $T_2$ coupled to form an inverter to provide the above functionality. It will be appreciated that the n-type gate drive circuit 310 may be configured in another manner for alternative embodiments to provide functionality similar to that of the configuration shown in FIG. 3.

The values of $V_{ACTIVE}$ and $V_{STDBY}$ may vary for different embodiments depending on several factors including, for example, the operating voltage and the process with which the circuit block 234 is fabricated. The higher the magnitude of $V_{ACTIVE}$, the lower the on-resistance of the leakage control transistor $L_1$ and thus, the smaller the leakage control transistor $L_1$ can be to provide a desired resistance. For one embodiment, $V_{ACTIVE}$ is as high as possible such that the sum of $V_{ACTIVE}$ and VDD is not higher than the highest $L_1$ gate voltage provided for by the process (i.e. application of the voltage VDD+$V_{ACTIVE}$ will not cause the $L_1$ gate oxide to break down). In this manner, the reliability of the leakage control transistor $L_1$ is not adversely affected during active modes when boosted gate drive is used. For alternative embodiments, $V_{ACTIVE}$ may have a smaller magnitude.

A higher magnitude of $V_{STDBY}$ provides a lower leakage current of the circuit block 240. Thus, for one embodiment, similar to the case above, the magnitude of $V_{STDBY}$ is as high as possible such that application of the voltage, $-V_{STDBY}$, at the gate of the leakage control transistor $L_1$ during a standby mode does not compromise the reliability of the leakage control transistor $L_1$. The magnitude of $V_{STDBY}$ may be different for alternative embodiments.

Figure 4:
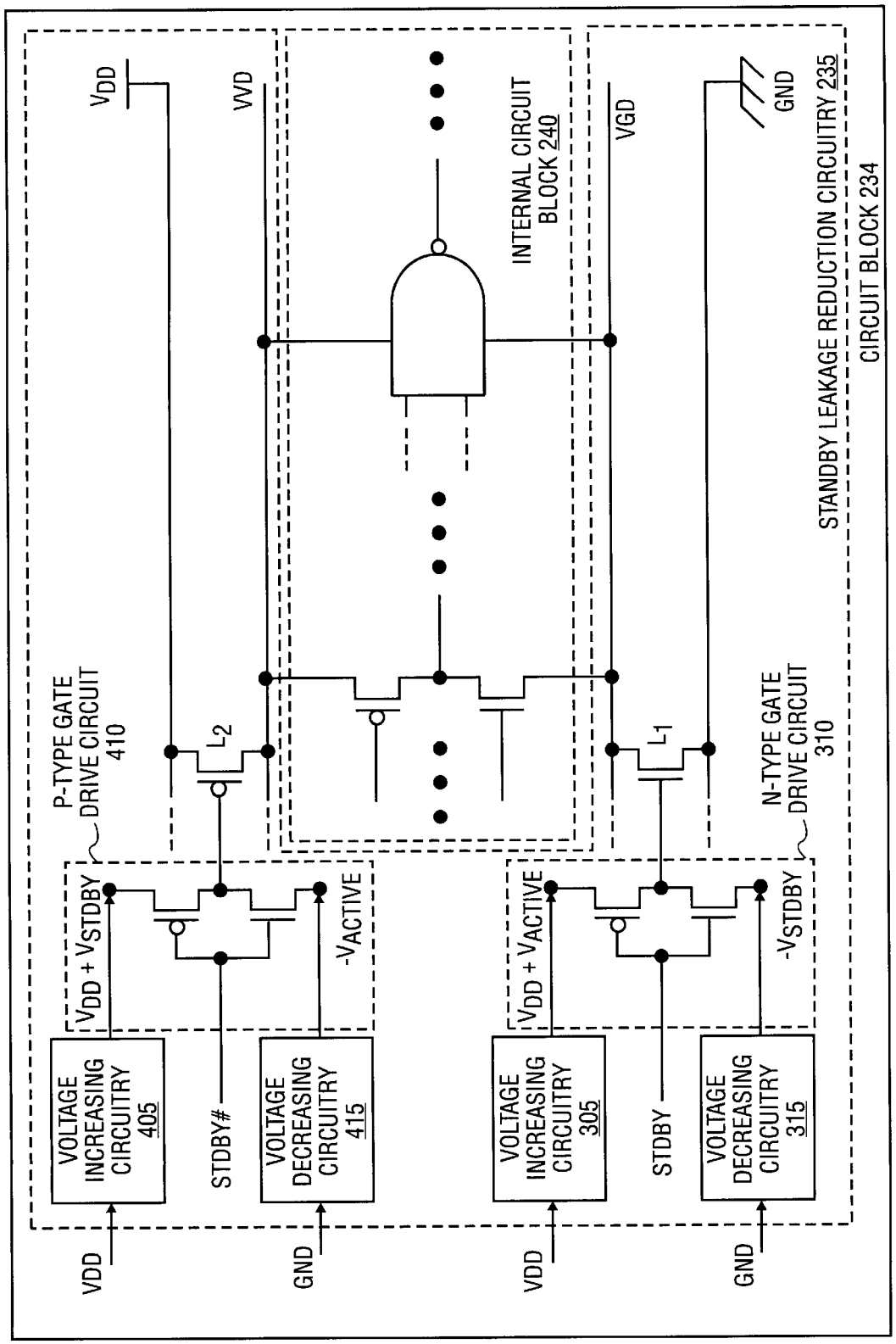
FIG. 4 is a schematic diagram showing an alternative embodiment of the standby leakage reduction circuitry including two leakage control transistors and associated gate drive circuitry.

FIG. 4 shows an alternative embodiment of the standby leakage reduction circuitry 235 that may be used to reduce the leakage current of a circuit block such as the internal circuit block 240. For the embodiment shown in FIG. 4, in addition to the leakage control transistor $L_1$, voltage increasing circuitry 305, n-type gate drive circuit 310 and voltage decreasing circuitry 315, the standby leakage reduction circuitry 235 includes a second leakage control transistor $L_2$, second voltage increasing circuitry 405, a p-type gate drive circuit 410, and second voltage decreasing circuitry 415.

The leakage control transistor $L_2$ has a first terminal coupled to a virtual power supply line VVD in series with the internal circuit block 240, a second terminal, a source terminal in this example, coupled to receive the supply voltage VDD, and a gate coupled to the p-type gate drive circuit 410. The p-type gate drive circuit 410 is referred to as such because it drives the gate of the p-type leakage control transistor $L_2$. For one embodiment, the leakage control transistor $L_2$ has a same threshold voltage as one or more p-type transistors in the internal circuit block 240 where the internal circuit block 240 includes both p- and n-type transistors. For one embodiment, the leakage control transistor $L_2$ has the same threshold voltage as a majority of p-type transistors in the internal circuit block 240.

The voltage increasing circuitry 405 is coupled to receive the supply voltage VDD. The voltage increasing circuitry 405 provides to the p-type gate drive circuit 410 an output voltage VDD+$V_{STDBY}$ that is higher than the supply voltage VDD.

For one embodiment, the voltage increasing circuitry 405 includes a charge pump to supply the higher output voltage and may be configured in a similar manner to the voltage increasing circuitry 305 of FIG. 3. For alternative embodiments, the voltage increasing circuitry 405 includes a switch capacitor, a different type of charge pump, or another means of providing a higher output voltage from a given input voltage.

The voltage decreasing circuitry 415 receives the ground supply voltage GND and provides to the p-type gate drive circuit 410 a voltage $-V_{ACTIVE}$ that is lower than GND. For one embodiment, the voltage decreasing circuitry 415 is configured in a manner similar to the voltage decreasing circuitry 315 of FIG. 3 and includes a negative charge pump to provide the lower output voltage from the ground input voltage. For alternative embodiments, a switch capacitor, a different type of negative charge pump, or another means of providing a lower output voltage from a given input voltage may be used to provide the voltage decreasing circuitry 415.

The p-type gate drive circuit 410 of one embodiment receives a complement of the standby signal STDBY shown as STDBY# and is configured in a similar manner to the n-type gate drive circuit 310. For an alternative embodiment, the p-type gate drive circuit 410 may be configured with the locations of the p-type and n-type transistors reversed and receive the STDBY signal instead of the STDBY# signal. For other alternative embodiments, the p-type gate drive circuit 410 may be configured in another manner to provide similar functionality.

For the embodiment shown in FIG. 4, the STDBY# signal controls the operation of the p-type gate drive circuit 410. When the STDBY signal is asserted (i.e. the circuit block 234 enters a standby mode), the STDBY# signal is low causing the voltage VDD+$V_{STDBY}$ supplied by the voltage increasing circuitry 405 to be applied to the gate of the p-type leakage control transistor $L_2$. Application of the standby gate voltage VDD+$V_{STDBY}$, which is higher than the supply voltage VDD, causes the gate-to-source voltage Vgs of the leakage control transistor $L_2$ to be reverse-biased.

Also as described above with reference to FIG. 3, when the STDBY signal is asserted, the standby gate voltage $-V_{STDBY}$ is applied at the gate of the leakage transistor $L_1$ causing the gate to source voltage Vgs of $L_1$ to be reverse-biased. Reverse-biasing of the gate-to-source voltages Vgs of both $L_1$ and $L_2$ for the embodiment shown in FIG. 4 cuts off the leakage path for the internal circuit block 240 during the standby mode. In this manner, the standby leakage current of the circuit block 234 is significantly reduced.

When the STDBY signal is deasserted indicating an active mode of the circuit block 234, the STDBY# signal is high causing the boosted gate drive voltage $-V_{ACTIVE}$ supplied by the voltage decreasing circuitry 415 to be applied at the gate of the leakage control transistor $L_2$. Application of the voltage $-V_{ACTIVE}$ to the gate of the leakage control transistor $L_2$ causes a boosted gate drive of the transistor $L_2$ because $-V_{ACTIVE}$ is below the ground supply voltage GND. In this manner, the resistance of the leakage control transistor $L_2$ is reduced during an active mode of the circuit block 234 such that the transistor $L_2$ can be smaller in size than a transistor with the same on-resistance where boosted gate drive is not used.

Additionally, when the STDBY signal is deasserted, the n-type gate drive circuit 340 causes the boosted gate drive voltage $-V_{STDBY}$ to be applied at the gate of the leakage control transistor $L_1$ as described above. In this manner, the drive of the gate of $L_1$ is boosted to also reduce its resistance.

The magnitudes of $V_{ACTIVE}$ and $V_{STDBY}$ may be chosen in a similar manner to that described above for the embodiment shown in FIG. 3. For the embodiment shown in FIG. 4 there is the additional constraint that it is preferable for $-V_{ACTIVE}$ to be higher (or more positive) than a voltage that causes the gate oxide of the p-type leakage control transistor $L_2$ to break down to avoid reliability problems. Similarly, it is preferable for $V_{STDBY}$ to be selected such that the voltage VDD+$V_{STDBY}$ does not cause the gate oxide of $L_2$ to breakdown. For some embodiments, to provide a selected reliability level, the magnitudes of $V_{STDBY}$ and $V_{ACTIVE}$ may be selected to be even smaller such that there is an additional guardband between the voltage applied to the leakage control transistor gates and the voltage at which the gate oxides break down.

Figure 5:
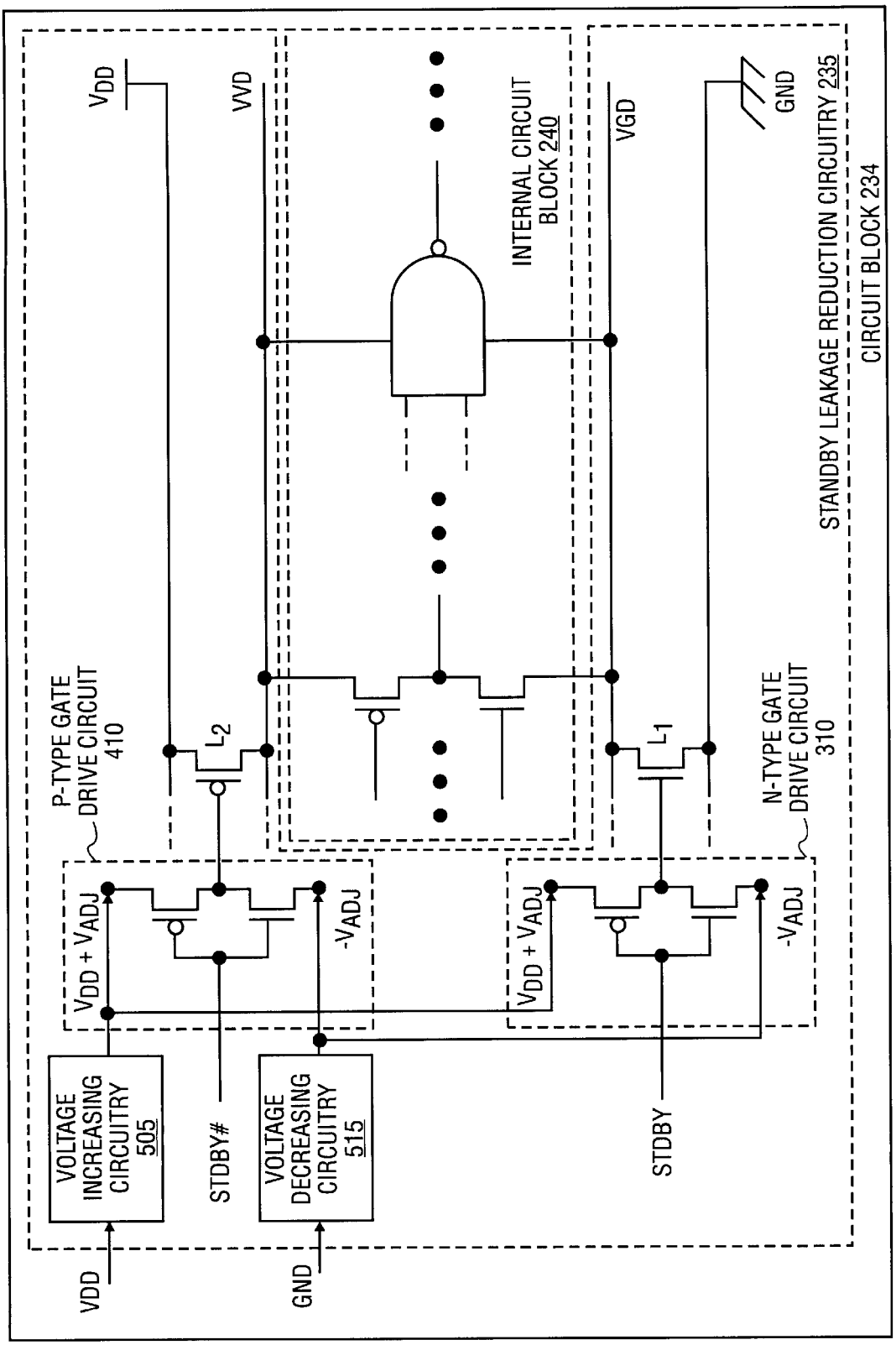
FIG. 5 is a schematic diagram showing another alternative embodiment of the standby leakage reduction circuitry including two leakage control transistors and associated gate drive circuitry.

For an alternative embodiment, $V_{STDBY}$ and $V_{ACTIVE}$ may be selected to be equal to each other. An example of such an embodiment is shown in FIG. 5. For the embodiment of FIG. 5, $V_{ACTIVE}$ equals $V_{STDBY}$ and is shown as $V_{ADJ}$. For this embodiment, only one voltage increasing circuit 505 and only one voltage decreasing circuit 515 are used thereby reducing the circuit space of the standby leakage reduction circuitry 235. The voltage increasing circuitry 505 receives the supply voltage VDD and provides an output voltage VDD+$V_{ADJ}$ which is higher than VDD. The voltage decreasing circuitry 515 receives the ground supply voltage GND and provides an output voltage $-V_{ADJ}$ which is lower than ground. The remainder of the circuit block 234 operates in a similar manner to the embodiment shown in FIG. 4.

For this embodiment, the voltage increasing and decreasing circuitry may be configured in the manner described above with reference to FIGS. 3 and 4. Further, the magnitude of $V_{ADJ}$ may be selected such that the magnitudes of the voltages applied to the gates of the leakage control transistors $L_1$ and $L_2$ during both standby and active modes are as high as possible within process reliability constraints. Other values for $V_{ADJ}$ may also be used for alternative embodiments.

It will be appreciated that, for another embodiment, a single leakage control transistor $L_2$ may be coupled between a power supply line VDD and a virtual power supply line VVD while the internal circuit block 240 is directly coupled to ground (i.e. the leakage control transistor $L_1$ and n-type gate drive circuit 310 are not included). For such an embodiment, the p-type gate drive circuit 410 operates in a similar manner to the p-type gate drive circuit 410 of FIG. 4 to boost the gate drive of $L_2$ during an active mode of the internal circuitry 240 and to cut off the leakage path of the internal circuitry 240 during a standby mode.

Figure 6:
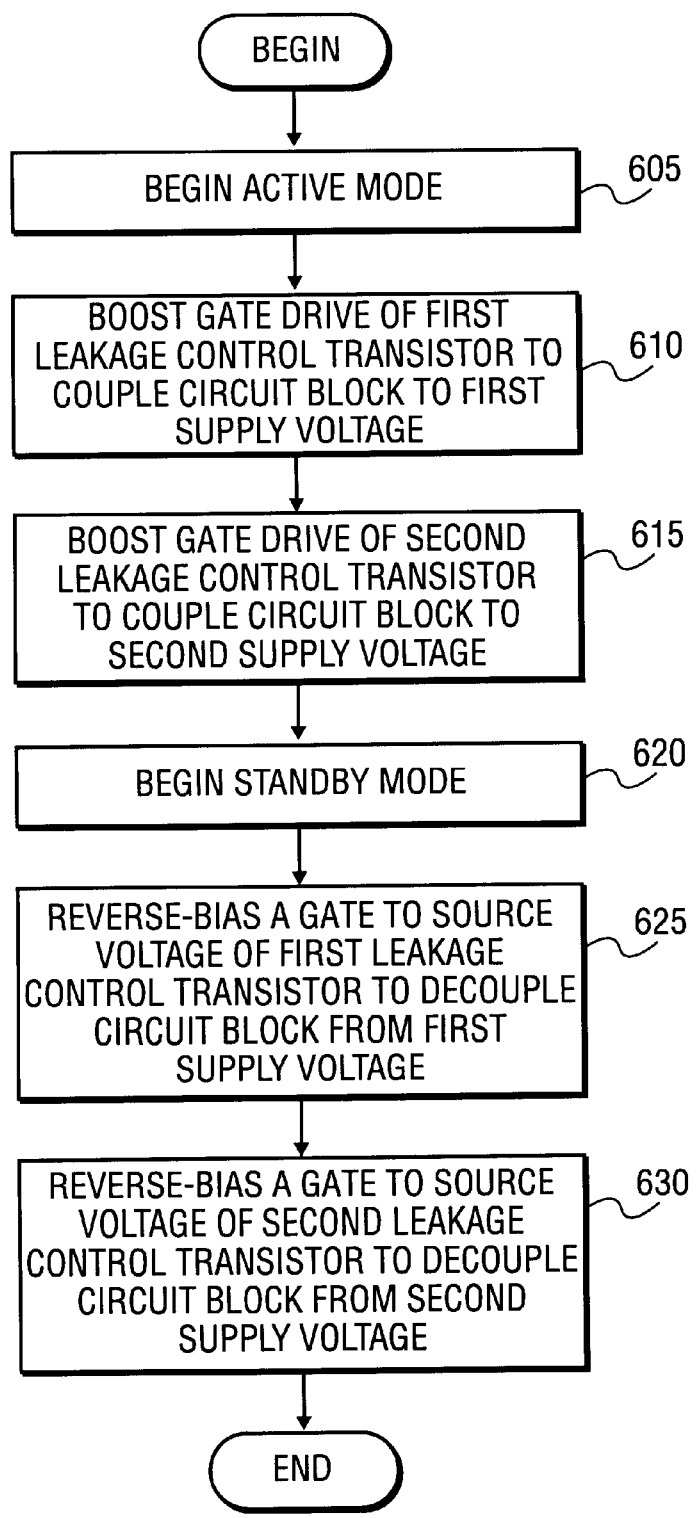
FIG. 6 is a flow diagram showing one embodiment of the standby leakage reduction method using boosted gate drive of leakage control transistors.

FIG. 6 is a flow diagram showing the standby leakage reduction and boosted gate drive method of one embodiment. In step 605, an active mode of a circuit block begins. In step 610, the gate drive of a first leakage control transistor is boosted to couple the circuit block to a first supply voltage. Similarly, in step 615, the gate drive of a second leakage control transistor is boosted to couple the circuit block to a second supply voltage.

When a standby mode begins in step 620, a gate-to-source voltage of the first leakage control transistor is reverse-biased to decouple the circuit block from the first supply voltage in step 625 and in step 626, a gate-to-source voltage of a second leakage control transistor is reverse-biased to decouple the circuit block from the second supply voltage.

Steps 605–615 may be repeated when the circuit block re-enters an active mode while steps 620–630 are repeated upon re-entering a standby mode.

For other embodiments, the standby leakage reduction and boosted gate drive method may include additional steps not shown in FIG. 6. Further, for some embodiments, not all steps shown in FIG. 6 are performed.

Various embodiments described above reduce leakage of a circuit block during a standby mode. Further, the leakage control transistors of some embodiments have the same threshold voltage as transistors of surrounding circuitry. In this manner, the process used to manufacture an integrated circuit including such circuitry does not have to provide for multiple threshold voltages for n-type and/or p-type transistors to implement the standby leakage approaches described.

Additionally, the boosted gate drive of various embodiments allows a smaller leakage control transistor to be used while still providing a low resistance between voltage supply lines and the circuitry to be controlled. This helps to save valuable integrated circuit space, especially where the standby leakage control approaches described above are used in many circuit blocks on a single integrated circuit die.

By reducing the standby leakage current of circuit blocks using embodiments described herein, it may be possible to alleviate the need for higher threshold voltage transistors for leakage reduction in future technologies.

In the foregoing specification, the invention has been described with reference to specific exemplary embodiments thereof. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:
    a first leakage control transistor coupled to receive a first supply voltage and to be coupled in series with an internal circuit block that performs a particular function, the internal circuit block being coupled to receive a high supply voltage and a low supply voltage, the first supply voltage being one of the high or low supply voltages; and a gate drive circuit to apply a boosted gate drive voltage to a gate of the leakage control transistor during an active mode of the internal circuit block and to apply a standby gate voltage to the gate during a standby mode of the internal circuit block, the boosted gate drive voltage being higher than the high supply voltage if the first leakage control transistor is an n-type transistor, the boosted gate drive voltage being lower than the low supply voltage if the first leakage control transistor is a p-type transistor.

2. The circuit block of claim 1 wherein the internal circuit block includes transistors and wherein the leakage control transistor has a threshold voltage substantially equal to at least one transistor in the internal circuit block.

3. The circuit block of claim 1 further comprising a second leakage control transistor coupled to receive a second supply voltage, wherein the gate drive circuit includes first and second gate drive circuits, the first gate drive circuit to apply a first boosted gate drive to a gate of the first leakage control transistor during the active mode of the internal circuit block and to apply a first standby gate voltage to the gate of the first leakage control transistor during the standby mode of the internal circuit block, the second gate drive circuit to apply a second boosted gate drive voltage to a gate of the second leakage control transistor during the active mode of the internal circuit block and to apply a second standby gate voltage to the gate of the second leakage control transistor during the standby mode of the internal circuit block.

4. The circuit block of claim 3 wherein the first leakage control transistor is an n-type leakage control transistor, the first supply voltage is a ground supply voltage, and the internal circuit block includes at least one n-type transistor and at least one p-type transistor, a threshold voltage of the first leakage control transistor being substantially equal to a threshold voltage of the at least one n-type transistor, and wherein the second leakage control transistor is a p-type leakage control transistor, the second supply voltage is a power supply voltage (VDD), a threshold voltage of the second leakage control transistor being substantially equal to a threshold voltage of the at least one p-type transistor.

5. The circuit block of claim 4 wherein the first boosted gate drive voltage is equal to the second standby gate voltage and the first standby gate voltage is equal to the second boosted gate drive voltage.

6. The circuit block of claim 1 wherein the standby mode is indicated by a signal and the active mode is indicated by the complement of the signal, and wherein the gate drive circuit is responsive to the signal to apply the boosted gate drive voltage during the active mode and the standby gate voltage during the standby mode.

7. A circuit comprising:

internal circuitry to perform a particular function, the internal circuitry being coupled to receive a high supply voltage and a low supply voltage; and a first leakage control transistor having a first terminal coupled to the internal circuitry, a second terminal coupled to receive a first supply voltage and a gate, the gate being coupled to receive a first boosted gate drive voltage when the internal circuitry is in an active mode, the gate being coupled to receive a first standby gate voltage when the internal circuitry is in a standby mode, the first boosted gate drive voltage being higher than the high supply voltage if the first leakage control transistor is an n-type transistor, the first boosted gate drive voltage being lower than the low supply voltage if the first leakage control transistor is a p-type transistor.

8. The circuit of claim 7 wherein the internal circuitry includes transistors, the leakage control transistor having a same threshold voltage as at least one of the transistors in the internal circuitry.

9. The circuit of claim 7 including a second leakage control transistor having a first terminal coupled to the internal circuitry, a second terminal coupled to receive a second supply voltage, and a gate, the gate being coupled to receive a second boosted gate drive voltage when the internal circuitry is in an active mode and a second standby gate voltage when the internal circuitry is in a standby mode.

10. The circuit of claim 9 wherein the internal circuitry includes transistors, the first and second leakage control transistors each having a same threshold voltage as at least one of the transistors in the internal circuitry.

11. The circuit of claim 7 wherein the first supply voltage is a ground supply voltage and the first leakage control transistor is an n-type transistor.

12. The circuit of claim 9 wherein the first supply voltage is a ground supply voltage, the second supply voltage is a power supply voltage, the first leakage control transistor is an n-type transistor and the second leakage control transistor is a p-type leakage control transistor.

13. The circuit of claim 9 wherein the first boosted gate drive voltage equals the second standby gate voltage and the second boosted gate drive voltage equals the first standby gate voltage.

14. A method for controlling leakage in a circuit block, the method comprising:

during a standby mode of the circuit block, reverse-biasing a gate to source voltage of a first leakage control transistor coupled to the circuit block; and during an active mode of the circuit block, boosting a gate drive of the first leakage control transistor, wherein boosting a gate drive includes driving a gate of the first leakage control transistor at a voltage higher than a high supply voltage powering the circuit block if the first leakage control transistor is an n-type transistor or driving the gate of the first leakage control transistor at a voltage lower than a low supply voltage powering the circuit block if the first leakage control transistor is a p-type transistor.

15. The method of claim 14 further including:

during the standby mode of the circuit block, reverse-biasing a gate to source voltage of a second leakage control transistor coupled to the circuit block; and during the active mode of the circuit block, boosting a gate drive of the second leakage control transistor.

16. The method of claim 14 wherein boosting the gate drive includes coupling the circuit block to a first supply voltage during the active mode of the circuit block, and reverse-biasing includes decoupling the circuit block from the first supply voltage during the standby mode, the first supply voltage being one of the high or low supply voltages.

17. The method of claim 14 further including coupling the circuit block to the high and low supply voltages during the active mode of the circuit block; and decoupling the circuit block from the high and low supply voltages during the standby mode of the circuit block.

18. A mobile computer system comprising:

a bus to communicate information;

a battery coupled to the bus;

an integrated circuit coupled to the bus to provide a standby signal to indicate a standby mode; and a processor coupled to the bus, the processor including a circuit block coupled to receive a high supply voltage and a low supply voltage, the circuit block including
- a first leakage control transistor coupled to receive a first supply voltage equal to one of the high or low supply voltages and coupled in series with an internal circuit block that performs a particular function, and
- a first gate drive circuit to apply a first boosted gate drive voltage to a gate of the first leakage control transistor during an active mode, the first boosted gate drive voltage being higher than the high supply voltage if the first leakage control transistor is an n-type transistor, the first boosted gate drive voltage being lower than the low supply voltage if the first leakage control transistor is a p-type transistor, the gate drive circuit further to apply a first standby voltage to the gate during the standby mode, the first standby gate voltage causing a gate to source voltage of the first leakage control transistor to be reverse-biased.

19. The mobile computer system of claim 18 wherein the internal circuit block includes transistors and wherein the first leakage control transistor has a threshold voltage substantially equal to at least one transistor in the internal circuit block.

20. The mobile computer system of claim 18 wherein the circuit block includes
- a second leakage control transistor coupled to receive a second supply voltage and coupled in series with the internal circuit block, the second supply voltage being equal to the other of the high or low supply voltages; and
- a second gate drive circuit to apply a second boosted gate drive voltage to a gate of the second leakage control transistor during the active mode, the gate drive circuit further to apply a second standby voltage to the gate during the standby mode, the second standby gate voltage causing a gate to source voltage of the second leakage control transistor to be reverse-biased.

21. The mobile computer system of claim 20 wherein the first leakage control transistor is an n-type leakage control transistor, the first supply voltage is a ground supply voltage, and the internal circuit block includes at least one n-type transistor and at least one p-type transistor, a threshold voltage of the first leakage control transistor being substantially equal to a threshold voltage of the at least one n-type transistor, and wherein the second leakage control transistor is a p-type leakage control transistor, the second supply voltage is a power supply voltage (VDD), a threshold voltage of the second leakage control transistor being substantially equal to a threshold voltage of the at least one p-type transistor.

\* \* \* \* \*